US012712332B2

(12) United States Patent
Kiessling et al.

(10) Patent No.: US 12,712,332 B2
(45) Date of Patent: Aug. 18, 2026

(54) RADIATION SOURCE AND A METHOD FOR GENERATING ELECTROMAGNETIC RADIATION AT A PLURALITY OF FREQUENCIES

(71) Applicants: HÜBNER GmbH & Co. KG, Kassel (DE); Fraunhofer-Gesellschaft zur Förderung der angewandten Forschung e.V., Munich (DE)

(72) Inventors: Jens Kiessling, Freiburg (DE); Maik-Hendrik Schubert, Göttingen-Herbershausen (DE); Marius Horst Jürgen Wenderoth, Kassel (DE); Korbinian Hens, Hamburg (DE)

(73) Assignees: HÜBNER GmbH & Co. KG, Kassel (DE); Fraunhofer-Gesellschaft zur Förderung der angewandten Forschung e.V., Munich (DE)

(*) Notice: Subject to any disclaimer, the term of this patent is extended or adjusted under 35 U.S.C. 154(b) by 503 days.

(21) Appl. No.: 18/379,348

(22) Filed: Oct. 12, 2023

(65) Prior Publication Data

US 2024/0128708 A1 Apr. 18, 2024

(30) Foreign Application Priority Data

Oct. 14, 2022 (EP) .................................... 22201560

(51) Int. Cl.
*H01S 5/00* (2006.01)
*G02F 1/35* (2006.01)
(Continued)

(52) U.S. Cl.
CPC ............ *H01S 5/0092* (2013.01); *G02F 1/353* (2013.01); *G02F 1/3546* (2021.01);
(Continued)

(58) Field of Classification Search
CPC ...... H01S 5/0092; H01S 3/1305; H01S 3/139; H01S 5/041; H01S 5/0605; G02F 1/353; G02F 1/3546
See application file for complete search history.

(56) References Cited

U.S. PATENT DOCUMENTS

2007/0035810 A1* 2/2007 Henderson ............ H01S 3/0675 359/330
2018/0188633 A1* 7/2018 Chuang .................. G02F 1/353

FOREIGN PATENT DOCUMENTS

JP 2002062555 A * 2/2002 ............ H01S 3/108
WO 2013/106456 A1 7/2013

* cited by examiner

*Primary Examiner* — Yuanda Zhang
(74) *Attorney, Agent, or Firm* — MEDLER FERRO WOODHOUSE & MILLS PLLC

(57) ABSTRACT

A radiation source includes an initial source, a non-linear optical frequency converter, a conversion detector and a controller. The controller is arranged such that in a first mode of operation, the controller generates the conversion control signal in dependence on the conversion measurement signal such that the resonance frequency is controlled to follow the initial centre frequency. The controller is selectably switchable between the first mode of operation and a second mode of operation. In the second operating mode the power of the converted radiation is controlled such that either the power of the converted radiation has a smaller relative variation over time than the power of the initial radiation in the beam direction in front of the coupling mirror or the power of the initial radiation in the beam direction behind the coupling mirror has a smaller relative variation over time than the power of the initial radiation in the beam direction in front of the coupling mirror.

10 Claims, 5 Drawing Sheets

(51) Int. Cl.
*H01S 3/13* (2006.01)
*H01S 3/139* (2006.01)
*H01S 5/04* (2006.01)
*H01S 5/06* (2006.01)

(52) U.S. Cl.
CPC ............ *H01S 3/1305* (2013.01); *H01S 3/139* (2013.01); *H01S 5/041* (2013.01); *H01S 5/0605* (2013.01)

1
22
17
16
11
10
12
3
4
7
9
8
5
6
2
14
11
21
15
11

RADIATION SOURCE AND A METHOD FOR GENERATING ELECTROMAGNETIC RADIATION AT A PLURALITY OF FREQUENCIES

CROSS REFERENCE TO RELATED APPLICATIONS

This application claims benefit of European Patent Application No. 22201560.4 filed Oct. 14, 2022, the entire contents of which is incorporated by reference herein.

The present invention relates to a radiation source for generating electromagnetic radiation at a plurality of frequencies, wherein the radiation source comprises an initial source, a non-linear optical frequency converter, a conversion detector and a controller. In this regard, the initial source is arranged to generate electromagnetic initial radiation comprising an initial centre frequency during operation of the radiation source. The non-linear optical frequency converter, for example an optical parametric oscillator, comprises a converter resonator which is resonant for the initial radiation and comprises an input coupling mirror which is partially transparent for the initial radiation and a nonlinear optical crystal arranged in the converter resonator. The frequency converter is located in a beam path of the initial radiation, so that during operation of the radiation source the initial radiation is coupled into the converter resonator through the coupling mirror. The frequency converter is arranged to generate converted radiation at a converted frequency from the initial radiation during operation of the radiation source, wherein the converted frequency is different from a frequency of the initial radiation. In this regard, the converter resonator comprises an actuator, wherein the actuator is located and arranged such that a resonance frequency of the converter resonator is tunable by the actuator in response to a conversion control signal. The conversion detector is located in a beam path of the converted radiation or in the beam path of the initial radiation in the beam direction behind the coupling mirror, such that the conversion detector detects a measure of the power of the converted radiation during operation of the radiation source and outputs a conversion measurement signal representing the measure of the power of the converted radiation. The controller is connected to the conversion detector such that the controller receives the conversion measurement signal during operation of the radiation source, wherein the controller is connected to the actuator such that the actuator receives the conversion control signal from the controller during operation of the radiation source. Further, during operation of the radiation source in a first mode of operation, the controller is arranged to generate the conversion control signal in response to the conversion measurement signal such that the resonant frequency is controlled to follow the initial centre frequency.

The present invention further relates to a method for generating electromagnetic radiation at a plurality of frequencies, wherein the method comprises the steps of: Generating electromagnetic initial radiation comprising an initial centre frequency using an initial radiation source, coupling the initial radiation through an coupling mirror into a converter resonator resonant to the initial radiation, generating converted radiation comprising a converted frequency from the initial radiation in a nonlinear optical crystal located in the converter resonator, wherein the converted frequency is different from a frequency of the initial radiation, detecting a measure of the power of the converted radiation using a conversion detector arranged in a beam path of the converted radiation or in the beam path of the initial radiation in the beam direction behind the coupling mirror and, in a first mode of operation, controlling a resonant frequency of the converter resonator as a function of the measure of the power of the converted radiation, so that the resonant frequency follows the initial centre frequency.

Prior art radiation sources are known that attempt to provide the widest possible wavelength coverage of the generated electromagnetic radiation. For example, it is known from the prior art to use a pump laser for pumping an optical parametric oscillator so that, in addition to the frequency of the electromagnetic pump radiation, the signal and Idler radiation of the optical parametric oscillator with signal centre frequency and Idler centre frequency different from the frequency of the pump radiation are also available. Such an assembly of pump laser and optical parametric oscillator is referred to as an initial source within the meaning of the present application. If now, as also known from the prior art, converted radiation is generated from the signal radiation by a further nonlinear process in a nonlinear optical frequency converter, for example by generating the second harmonic in a nonlinear optical crystal, such a radiation source can address four wavelengths different from each other.

In order to provide the required power also for the converted radiation generated from the initial radiation by a nonlinear optical process, a nonlinear optical crystal is located for the nonlinear optical frequency converter in a converter resonator resonant for the initial radiation. The power of the converted radiation generated in the frequency converter from the initial radiation then depends on a large number of parameters. An essential factor is the difference between the initial centre frequency and the resonance frequency of the converter resonator. If the initial centre frequency changes while the resonance frequency of the converter resonator remains constant, the power of the converted radiation also changes.

Therefore, it is established in the prior art to detect a measure of the power of the converted radiation and to use a conversion measurement signal representing this measure to control the resonance frequency. In this way, the resonance frequency follows the initial centre frequency and the power of the converted radiation is maximised at all times but fluctuates greatly with the initial centre frequency. These power fluctuations and drifts are typically on the order of several percent of the total power of the converted radiation.

For many applications of such a radiation source, this prior art control of the resonance frequency is ideal because it always results in the maximum power of the converted radiation under given conditions. However, there are applications, for example methods for calibrating measuring instruments, which require a stable power that is essentially constant over time. For this, one accepts that the overall power level is lower than the maximum that can be provided by controlling the resonance frequency. Therefore, power stabilisers or "noise eaters", for example based on acousto-optical or electro-optical modulators, are known from the prior art downstream of a nonlinear optical frequency converter. These lead to a smoothing of the fluctuations in the power of the converted radiation, but reduce the overall power level and increase the apparatus-related cost.

It is therefore an object of the present invention to provide a radiation source which enables a wider range of applications to be provided for such a radiation source. At the same time, it is important to make the apparative effort as efficient as possible.

The aforementioned object is solved by a radiation source according to independent claim 1 of the present application.

For this purpose, the controller of a radiation source for generating electromagnetic radiation at a plurality of frequencies of the type mentioned at the beginning is set up in such a way that the controller can be switched selectably between the first mode of operation and a second mode of operation during operation of the radiation source. Thereby, the controller is arranged to generate the conversion control signal in the second mode of operation such that the power of the converted radiation is controlled such that either the power of the converted radiation has a smaller relative variation over time than the power of the initial radiation in the beam direction before the coupling mirror or the power of the initial radiation in the beam direction behind the coupling mirror has a smaller relative variation over time than the power of the initial radiation in the beam direction before the coupling mirror.

It is the fundamental idea of the present invention to make the radiation source switchable for a user, so that the user can select whether the control of the frequency converter is such that either the maximum power of the converted radiation is available at all times, but at the price of a larger relative power fluctuation, or the converted radiation or the initial radiation in the beam direction behind the coupling mirror is available with reduced relative power fluctuation, but with lower absolute power. The initial radiation in the beam direction in front of the coupling mirror, i.e. in the beam direction in front of the converter resonator, serves as a comparison standard for the relative variation over time of the power of either the converted radiation or the initial radiation in the beam direction behind the coupling mirror.

With the solution according to the invention, either the relative variation over time of the power of the converted radiation or the relative variation over time of the initial radiation can be reduced in the second mode of operation.

The power consumption of the initial radiation by the frequency converter depends on how large the actual conversion of the initial radiation in the frequency converter into the converted radiation is. Therefore, by controlling the power of the converted radiation via the resonance frequency of the conversion resonator, a temporal fluctuation of the power of the output radiation reflected by the coupling mirror of the conversion resonator can also be reduced as an alternative to the power of the converted radiation itself. In a sense, the frequency converter then serves as a “noise eater” for the output radiation.

In an embodiment of the invention, the coupling mirror is located such that the initial radiation reflected from the coupling mirror and not transmitted into the converter resonator is reflected from the coupling mirror at an angle different from 90°.

In an embodiment of the invention, the non-linear optical frequency converter is selected from a frequency doubler, a sum frequency generation device, a difference frequency generation device, a device for providing an optical parametric process or a device for 4-wave mixing.

In an embodiment of the invention, the nonlinear optical frequency converter is a frequency doubler, wherein then the nonlinear optical crystal is a doubler crystal such that the converted frequency is equal to twice the frequency of the output radiation.

Regardless of which nonlinear optical process is used in the frequency converter to generate the converted radiation, the frequency converter according to the invention always comprises a converter resonator which is resonant for the initial radiation and thus leads to an excess of conversion efficiency in the nonlinear optical crystal.

In an embodiment of the invention, the coupling mirror through which the initial radiation is coupled into the converter resonator is a partially transparent mirror for the initial radiation. Such a partially transparent mirror results in a portion of the initial radiation always being reflected at the coupling mirror.

In an embodiment, the initial source comprises a pump laser and an optical parametric oscillator, wherein the pump laser is arranged to generate electromagnetic pump radiation during operation of the radiation source, wherein the optical parametric oscillator (OPO) is located in an optical path of the pump radiation, and wherein the optical parametric oscillator is arranged to generate signal radiation comprising a signal centre frequency and Idler radiation from the pump radiation during operation of the radiation source such that the signal radiation is the initial radiation.

An optical parametric oscillator within the meaning of the present application comprises a linear optical OPO crystal in an optical resonator. During operation of the radiation source, the crystal generates electromagnetic radiation with two wavelengths from the pump radiation generated by the pump laser and irradiated into the resonator via a non-linear 3-wave interaction. Electromagnetic radiation generated in the OPO is called signal radiation and Idler radiation. The OPO resonator is resonant at least for the Idler radiation or the signal radiation. The resonant enhancement of the signal radiation or the Idler radiation in the OPO results in a parametric amplification with appreciable conversion efficiency. From the conservation of energy it follows that the sum of the signal frequencies of the signal radiation and the Idler frequency of the Idler radiation is equal to a pump frequency of the pump radiation. The OPO resonator is to be distinguished from the converter resonator of the non-linear optical frequency converter of the radiation source according to the invention.

For the purposes of the present application, the terms signal radiation and Idler radiation are used to denote the electromagnetic radiation with the two different frequencies or wavelengths in the OPO. This is completely independent of whether the signal radiation has a signal centre frequency larger than the Idler centre frequency of the Idler radiation or vice versa. This is in contrast to the use of the term signal radiation for the radiation with the higher frequency (shorter wavelength) produced in the OPO, which can be found in some places in the literature.

The conversion detector is used to detect a measure of the power of the converted radiation. The conversion detector outputs a conversion measurement signal representing this measure of the power of the converted radiation. The conversion measurement signal is used by the controller to control the converter resonator.

A measure of the power of the converted radiation can be detected at two different positions in the beam path of the radiation source. Firstly, the conversion detector may be located so that it is located in the beam path of the converted radiation and so directly detects the power of the converted radiation.

However, the power of the initial radiation at a position in the beam path of the initial radiation after partial reflection at the coupling mirror is also a measure of the power of the converted radiation. Any change in the power of the converted radiation, since the converted radiation arises from the initial radiation, also leads to a change in the power of the initial radiation partially reflected at the coupling mirror.

In an embodiment, the controller is a processor or a computer comprising a processor wherein the processor runs software suitably arranged for the control described. However, in an embodiment of the invention, the controller may also be an analogue-electronic controller.

According to the invention, the controller can be switched between two modes of operation. In the first mode of operation, the resonance frequency of the converter resonator is controlled to follow the initial centre frequency which is used to pump the frequency converter. If the resonance frequency matches the initial centre frequency, the maximum power of converted radiation is produced for a given power of initial radiation.

Suitable techniques or methods for controlling the resonance frequency so that it follows the initial centre frequency are a method according to Pound-Drever-Hall (PDH locking; see Eric D. Black "An introduction to Pound-Drever-Hall laser frequency stabilization", Am. J. Phys. 69 (1), pages 79 to 87, January 2001), a method according to Hansch-Couillaud (see T. W. Hänsch and B. Couillaud "Laser frequency stabilization by polarization spectrocopy of a reflecting reference cavity", Optics Communications, vol. 35, no. 3, pages 441 to 444, December 1980) or a lock-in method (see, for example, D. C. Gerstenberger et al. "Efficient second-harmonic conversion of cw single-frequency Nd:YAG laser light by frequency locking to a monolithic ring frequency doubler", Optics Letters, vol. 16, no. 18, pages 992 to 994; July 1991).

In an embodiment of the invention, the resonance frequency control follows the method according to Pound-Drever-Hall. Therefore, in an embodiment, the radiation source comprises a modulator, wherein the modulator is located in the beam path of the initial radiation between the optical parametric oscillator and the coupling mirror of the frequency converter, wherein the modulator is arranged to impose a phase modulation with a modulation frequency on the initial radiation, and wherein the controller is arranged to perform in the first mode of operation the steps of i) mixing the conversion measurement signal with a reference signal modulated at the modulation frequency to form a mixed signal comprising a non-modulated term and a term modulated at twice the modulation frequency,
ii) filtering the mixed signal to produce an error signal containing only the non-modulated term; and
iii) generating the conversion control signal such that the error signal is minimised.

In an embodiment of the invention, a modulation signal at the modulation frequency for driving the modulator and the reference signal, which is also modulated at the modulation frequency, originate from the same signal source, but preferably from the controller.

In an embodiment of the invention, the modulator is an electro-optic modulator or a photoacoustic modulator.

In an embodiment of the invention, the modulator is connected to the controller such that the modulator receives a modulator control signal from the controller during operation of the radiation source, wherein the controller is arranged to generate the modulator control signal during operation of the radiation source in the first mode of operation such that the modulator effectively modulates the initial radiation and to generate the modulator control signal in the second mode of operation such that the modulator does not effectively modulate the initial radiation. Since control in the second mode of operation does not require modulation of the initial radiation, further reduction of a signal noise may be effected in the second mode of operation by disabling modulation of the initial radiation.

In an embodiment of the invention, the controller in the second mode of operation implements a so-called side-of-fringe locking (SoF locking). For this purpose, the controller in the second mode of operation performs the steps:

a) forming an error signal as the difference between the conversion measurement signal and a predetermined, constant offset signal, and
b) generating the conversion control signal so that the error signal becomes minimal.

The basic idea of this method for power stabilisation, as used for the second mode of operation, is to position the resonance frequency outside the signal centre frequency. In this way, by controlling the resonance frequency, the power of the converted radiation can then be stabilised. Upward and downward fluctuations around a defined value for the power can be compensated by changing the resonance frequency. In contrast, this is not the case if the resonance frequency is equal to the initial centre frequency. Then the power of the converted radiation can only be reduced.

The actuator of the converter resonator serves to tune the resonance frequency of the converter resonator depending on a conversion control signal. In an embodiment of the invention, such an actuator is a mirror arranged on a linear actuator, wherein the linear actuator is, for example, a piezoelectric crystal. Further examples of a suitable actuator are an electro-optical modulator, an acousto-optical modulator or a filter, for example a Fabry-Perot resonator, which are introduced into the beam path of the converter resonator, here in particular into the beam path of the signal radiation in the converter resonator, or a heating element for varying the temperature of the nonlinear optical crystal in the converter resonator.

In an embodiment of the invention, the radiation source comprises an initial radiation detector. The initial radiation detector is located in the beam path of the initial radiation in front of the coupling mirror, such that during operation of the radiation source the initial radiation detector detects a measure of the power of the initial radiation (in front of the coupling mirror) and outputs an initial radiation measurement signal representing the measure of the power of the initial radiation. The controller is connected to the initial radiation detector such that the controller receives the initial radiation measurement signal during operation of the radiation source. The controller is further connected to the initial source, for example to the pump laser, such that the initial source receives an initial radiation control signal from the controller during operation of the radiation source, wherein the controller is arranged such that during operation of the radiation source the initial radiation control signal is generated in dependence on the initial radiation measurement signal such that an initial power of the initial radiation, in particular a pump power of the pump laser, is controlled such that the initial power is substantially equal to a predetermined target initial power.

With such an embodiment of the invention, in addition to controlling the power of either the initial radiation in the beam direction behind the coupling mirror of the frequency converter or the converted radiation by means of the frequency converter, the initial radiation is stabilised already in front of the frequency converter by controlling the power of the initial radiation provided by the initial source. In this case, the control or regulation of the power of the radiation generated by the initial source can be performed indirectly or directly. An example of an indirect controller is the controller of the current of a laser diode of an initial laser, in particular the laser diode of a pump laser. Indirect control is achieved, for example, by means of a modulator of the initial source.

In an embodiment, the radiation source is configured such that the frequency converter comprises the initial source a pump laser and an OPO, wherein the radiation source emits at least two of converted radiation, signal radiation, Idler radiation and pump radiation during operation. In an embodiment of the invention, the radiation source simultaneously or selectably emits all four of the aforementioned radiations. Such a source has an extremely versatile applicability.

The above object is further solved by a method according to the independent claim directed thereto. For this purpose, the method of the type mentioned above additionally comprises the steps of: selectably switching between the first mode of operation and a second mode of operation, in the second mode of operation controlling the power of the converted radiation so that either the power of the converted radiation has a smaller relative variation over time than the power of the initial radiation in the beam direction behind the coupling mirror or the power of the initial radiation in the beam direction behind the coupling mirror has a smaller relative variation over time than the power of the initial radiation in the beam direction behind the coupling mirror.

Insofar as aspects of the invention have been described previously with respect to the radiation source, these also apply to the corresponding method for generating electromagnetic radiation at a plurality of frequencies and vice versa. Insofar as the method is carried out by a radiation source in accordance with the present invention, the radiation source comprises the appropriate means therefor. In particular, however, embodiments of the radiation source are suitable for carrying out the embodiments of the method described herein.

Further advantages, features and possible applications of the present invention become apparent from the following description of embodiments and the accompanying figures. In the figures, the same elements are designated with the same reference numbers.

Figure 1:
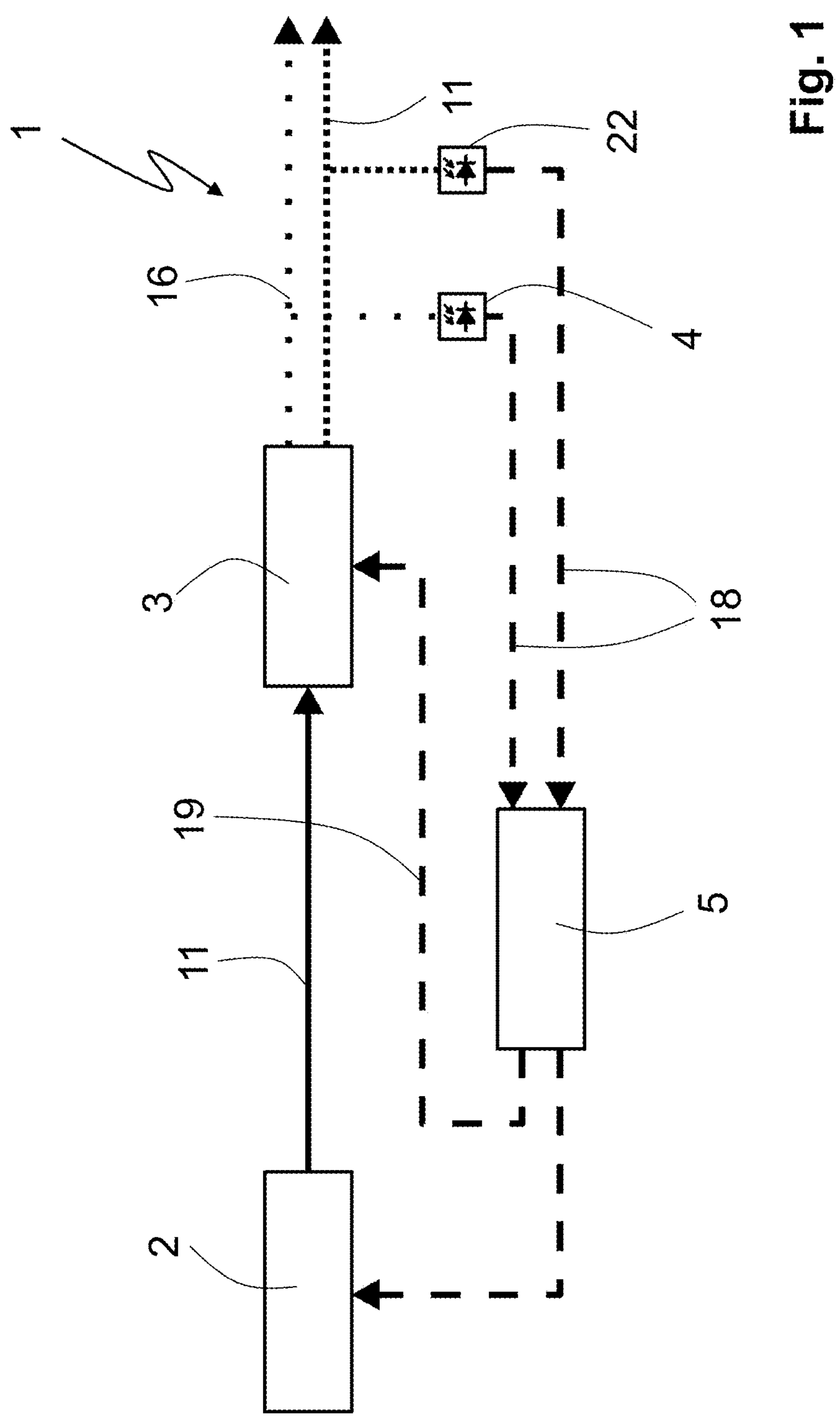
FIG. 1 is a schematic block diagram of an embodiment of the radiation source according to the invention.

FIG. 1 illustrates in a block diagram the basic idea of a radiation source 1 according to the invention. The radiation source 1 comprises an initial source 2, a frequency converter 3, a conversion detector 4 or 22 and a controller 5.

The initial source 2 generates an electromagnetic initial radiation 11 comprising an initial centre frequency. The frequency converter comprises a converter resonator which is resonant for the initial radiation 11 and comprises a coupling mirror which is partially transparent for the initial radiation 11 and a non-linear optical crystal arranged in the converter resonator. The initial radiation 11 is used to pump the non-linear optical frequency converter 3. For this purpose, the initial radiation 11 is coupled into the converter resonator through the coupling mirror.

The frequency converter 3 generates converted radiation 16 at a converted frequency from the initial radiation 11, wherein the converted frequency is different from a frequency of the initial radiation 11. The converter resonator of the frequency converter 3 comprises an actuator tunable to tune the resonance frequency of the converter resonator in response to a conversion control signal 19.

A conversion detector 4 or 22 is used to detect a measure of the power of the converted radiation 16 and to output a conversion measurement signal 18 representing the measure of the power of the converted radiation 16 to a controller 5. A measure of the power of the converted radiation 16 can be determined either by measuring the power of the converted radiation 16 or by measuring the power of the initial radiation 11 not converted in the frequency converter 3. Both variants are shown schematically in FIG. 1. In the first case, the conversion detector 4 is located in a beam path of the converted radiation 16. In the second case, the conversion detector 22 is located in a beam path of the unconverted initial radiation behind the frequency converter 3.

In addition to the conversion detector 4, 22, the controller 5 is also connected to the actuator so that the actuator receives the conversion control signal 19 from the controller 5. In a first mode of operation, the controller generates the conversion control signal 19 in response to the conversion measurement signal 18 such that the resonance frequency is controlled to follow the initial centre frequency. The controller 5 is selectably switchable between the first mode of operation and a second mode of operation. In the second mode of operation, the controller 5 generates the conversion control signal 19 such that the power of the converted radiation 16 is controlled such that either the power of the converted radiation 16 has a smaller relative variation over time than the power of the initial radiation 11 in the beam direction in front of the frequency converter or in front of its coupling mirror, or the power of the initial radiation 11 in the beam direction behind the coupling mirror 12 has a smaller relative variation over time than the power of the initial radiation 11 in the beam direction in front of the coupling mirror.

Figure 2:
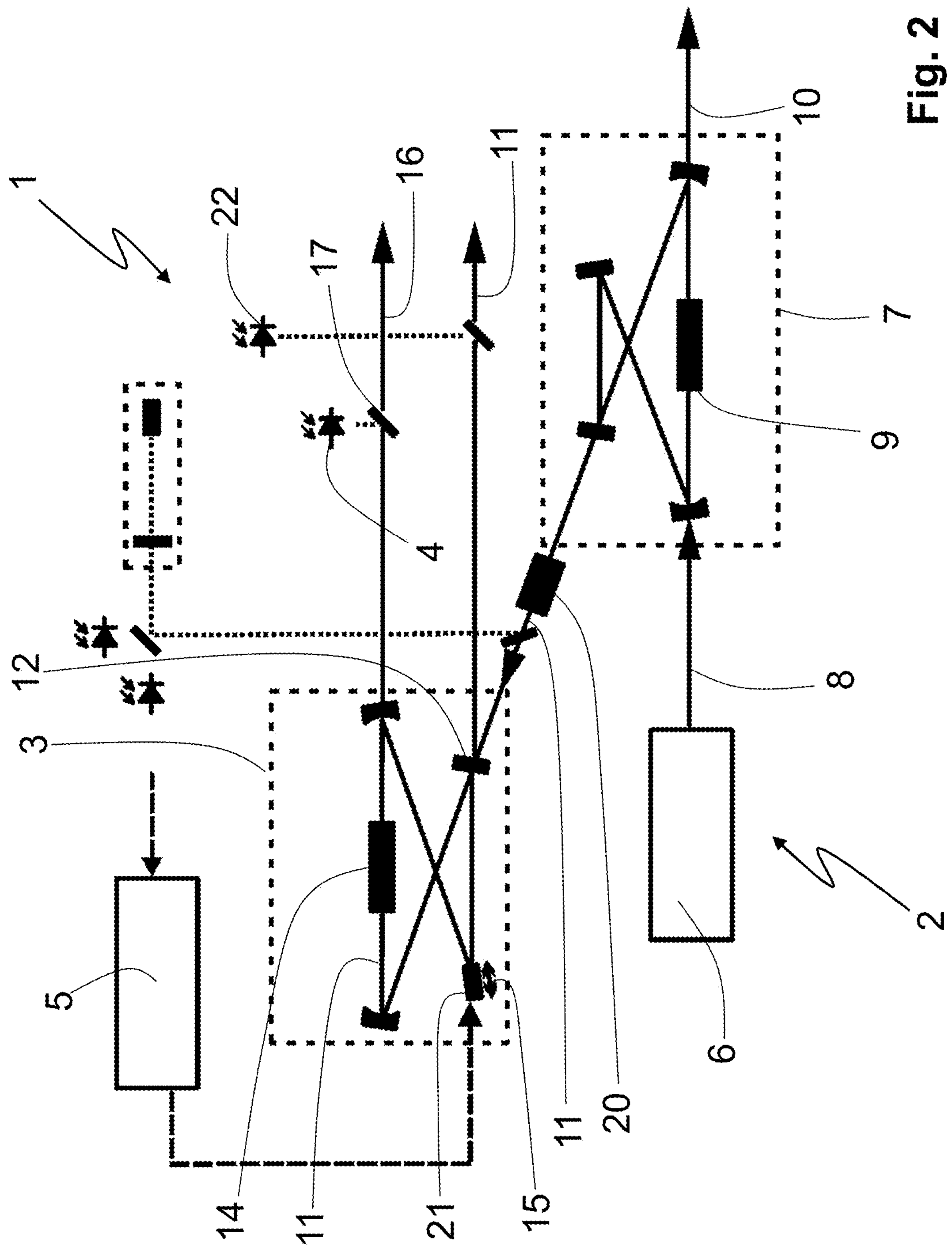
FIG. 2 is a schematic representation of a second embodiment of the radiation source according to the invention in a first mode of operation.
Figure 3:
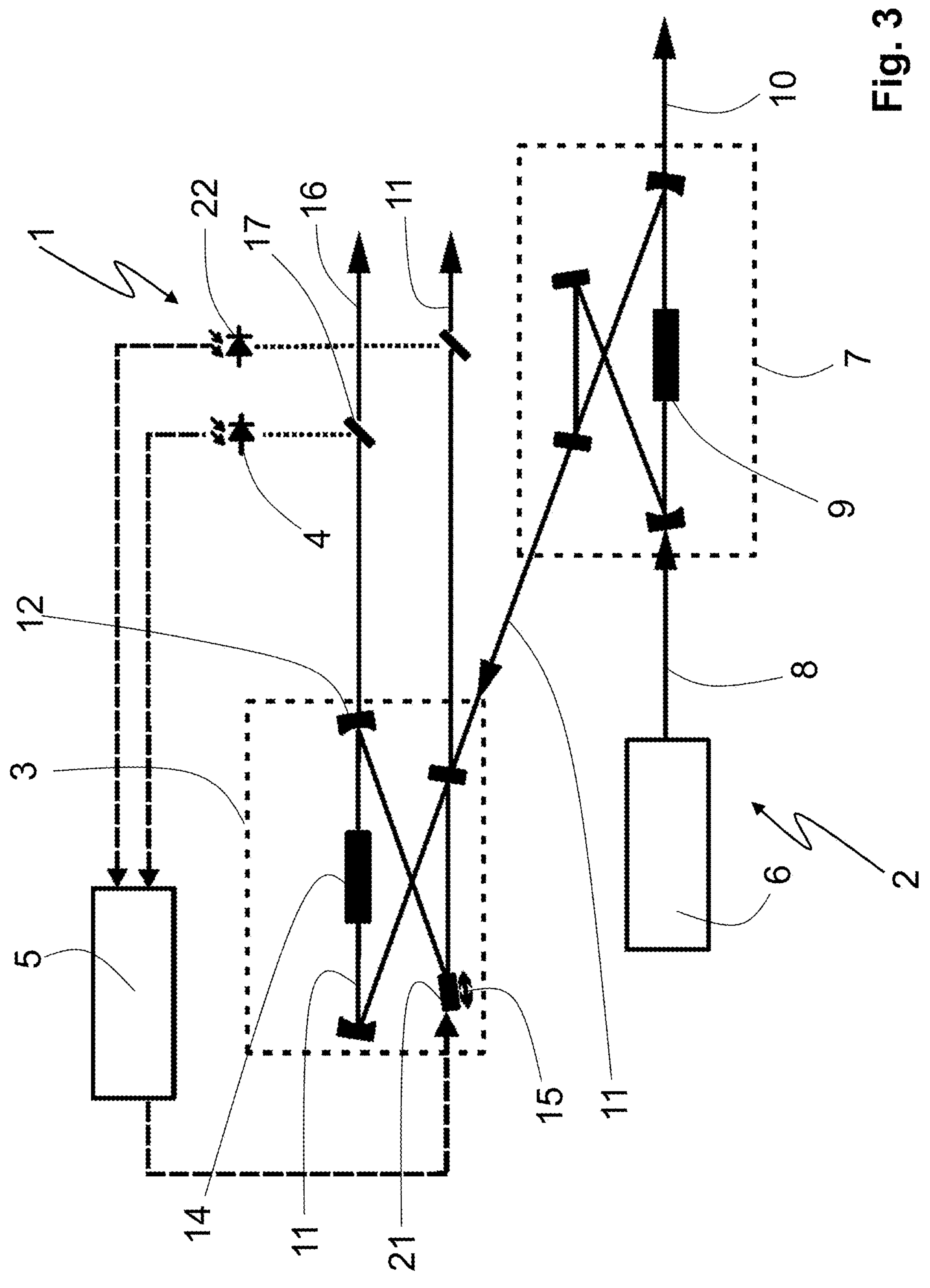
FIG. 3 is a schematic representation of the second embodiment of the radiation source according to the invention of FIG. 2 in a second mode of operation.

FIGS. 2 and 3 show a concrete implementation of a radiation source 1 according to the block diagram of FIG. 1. As before, the radiation source 1 of FIGS. 2 and 3 comprises an initial source 2, a frequency converter 3, a conversion detector 4 and a controller 5.

In the actual implementation, the initial source 2 is composed of a pump laser 6 and an optical parametric oscillator (OPO) 7. The pump laser 6 generates pump radiation 8 having a pump centre frequency. The pump radiation 8 is coupled into the OPO and generates idler radiation 10 and signal radiation 11 in a non-linear optical crystal 9.

In the embodiment shown, the signal radiation 11 is used to pump a frequency converter in the form of a frequency doubler 3. In the embodiment shown, the frequency doubler 3 comprises a doubler resonator designed as a ring resonator 13 with four mirrors. A non-linear optical doubler crystal 14 is located in the ring resonator 13. The doubler resonator 13 is resonant for the signal radiation 11, so that the non-linear optical process of frequency doubling in the doubler crystal 14 experiences an increase.

While the mirror denoted by the reference number 12 serves as a coupling mirror for the signal radiation 11, another mirror 21 is mounted on a piezo adjuster 15 as an actuator within the meaning of the present application. With the aid of the piezo adjuster 15, the length of the resonator 13 and thus the resonance frequency can be adjusted and controlled with the aid of the controller 5. In the doubler crystal 14, in comparison with the signal radiation 11 frequency-doubled converted radiation 16 is generated from the signal radiation 11 during operation of the radiation source 1.

A beam splitter 17 is located in the beam path of the frequency-doubled radiation 16. Via the beam splitter 17 a part of the frequency-doubled radiation 16 is coupled out and directed to the conversion detector 4. The conversion detector 4 in the beam path of the frequency-doubled radiation 16 detects a measure of the power of the frequency-doubled radiation 16.

In turn the controller 5 is, on the one hand, connected to the conversion detector 4 in such a way that, during operation of the radiation source 1, the controller 5 receives a conversion measurement signal, which represents the measure of the power of the frequency-doubled radiation 16, from the conversion detector 4. On the other hand, the controller 5 is connected to the piezo-actuator 15 so that during operation the controller 5 receives a conversion control signal 19 from the controller 5.

The controller 5 allows a user to select characteristics of the frequency-doubled radiation 16 in terms of its absolute power and relative variation over time of the power.

In the embodiment shown, the controller 5 is programmed to allow a user to select between a first and a second mode of operation via a user interface and to switch the control of the resonator length of the doubler resonator 13 between these modes of operation. The first mode of operation is shown schematically in FIG. 2 and the second mode of operation is shown in FIG. 3.

In the first mode of operation, the resonance frequency is controlled using a method according to Pound-Drever-Hall. For this purpose, an electro-optical modulator 20 is provided in the radiation source 1 in the beam path of the signal radiation 11 between the OPO 7 and the coupling mirror 12 of the frequency doubler 3. The modulator 20 is in turn connected to the controller 5 in such a way that the controller 5 presets a modulation frequency for the modulator 20, at which the modulator imposes a phase modulation on the signal radiation 11. The controller 5 also uses the modulation frequency as a reference frequency when controlling the resonator length.

The aim of controlling the resonator length in the first mode of operation is to provide the maximum available power of the converted radiation 16 at any time, wherein a larger relative variation over time of the power of the frequency-doubled radiation 16 is accepted.

The relative variation over time of the power of the frequency-doubled radiation 16 is compared to the relative variation over time of the signal radiation 11 in front of the coupling mirror 12, for example where the reference number of the reference number 11 in FIG. 2 points to the signal radiation 11.

In the first mode of operation, the controller mixes the conversion measurement signal 18 with the reference signal to form a mixed signal comprising a non-modulated (DC) term and a term modulated at twice the modulation frequency. The DC term can be easily filtered out of this mixed signal. This is used as the error signal of the resonator length control. The conversion control signal 19 is generated in such a way that the error signal becomes minimal.

The resonator length now follows any change in the centre frequency of the signal radiation 11 and the power of the frequency-doubled radiation 16 is essentially always equal to the maximum possible output line of the frequency doubler 3, but is subject to comparatively large relative variations over time.

Figure 5:
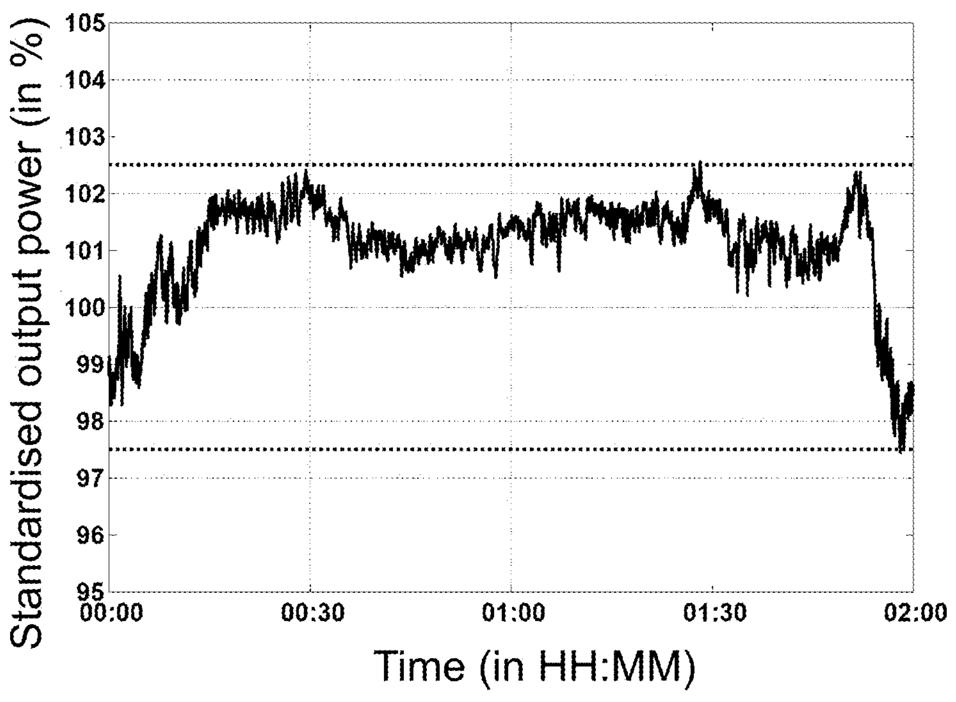
FIG. 5 is a plot of the power of the converted radiation over time, wherein the radiation source of FIGS. 2 and 3 is in the first mode of operation.

The time curve of the power of the frequency-doubled radiation 16 from the radiation source in FIGS. 2 and 3 is shown for the first mode of operation of FIG. 2 as an example in the graph in FIG. 5.

When switching to the second mode of operation, the modulator 20 is switched off by the controller via the modulator control signal 21, since the control in the second mode of operation does not require phase modulation of the signal radiation 11. This second mode of operation is shown schematically in FIG. 3, in FIG. 3 the modulator 20 is not shown.

The aim of the second mode of operation is to provide the frequency-doubled radiation 16 with reduced relative power fluctuation. However, this is done at lower absolute power. For this purpose, the controller 5 performs a so-called side-of-fringe locking in the second mode of operation. For this purpose, the controller 5 forms an error signal as the difference between the conversion measurement signal 18 and a predetermined, constant offset signal. The conversion control signal 19 is generated so that the error signal becomes minimal.

Figure 6:
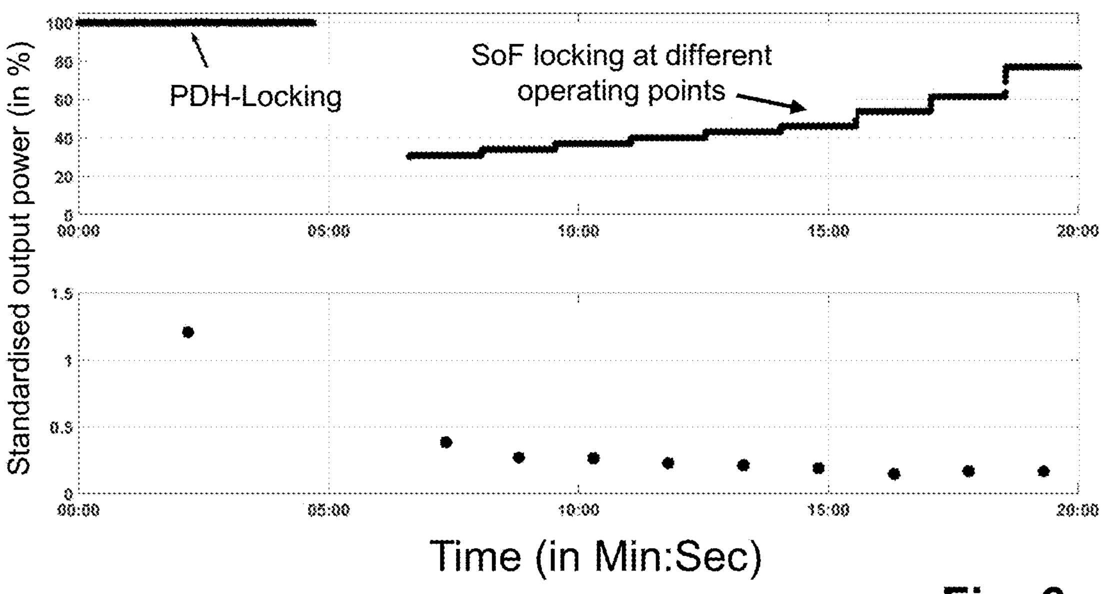
FIG. 6 is a plot of the power of the converted radiation over time, wherein the radiation source of FIGS. 2 and 3 is in the second mode of operation.

The time evolution of the power of the frequency-doubled radiation 16 from the radiation source of FIGS. 2 and 3 is exemplarily shown for the second mode of operation of FIG. 3 in the graph of FIG. 6.

Figure 4:
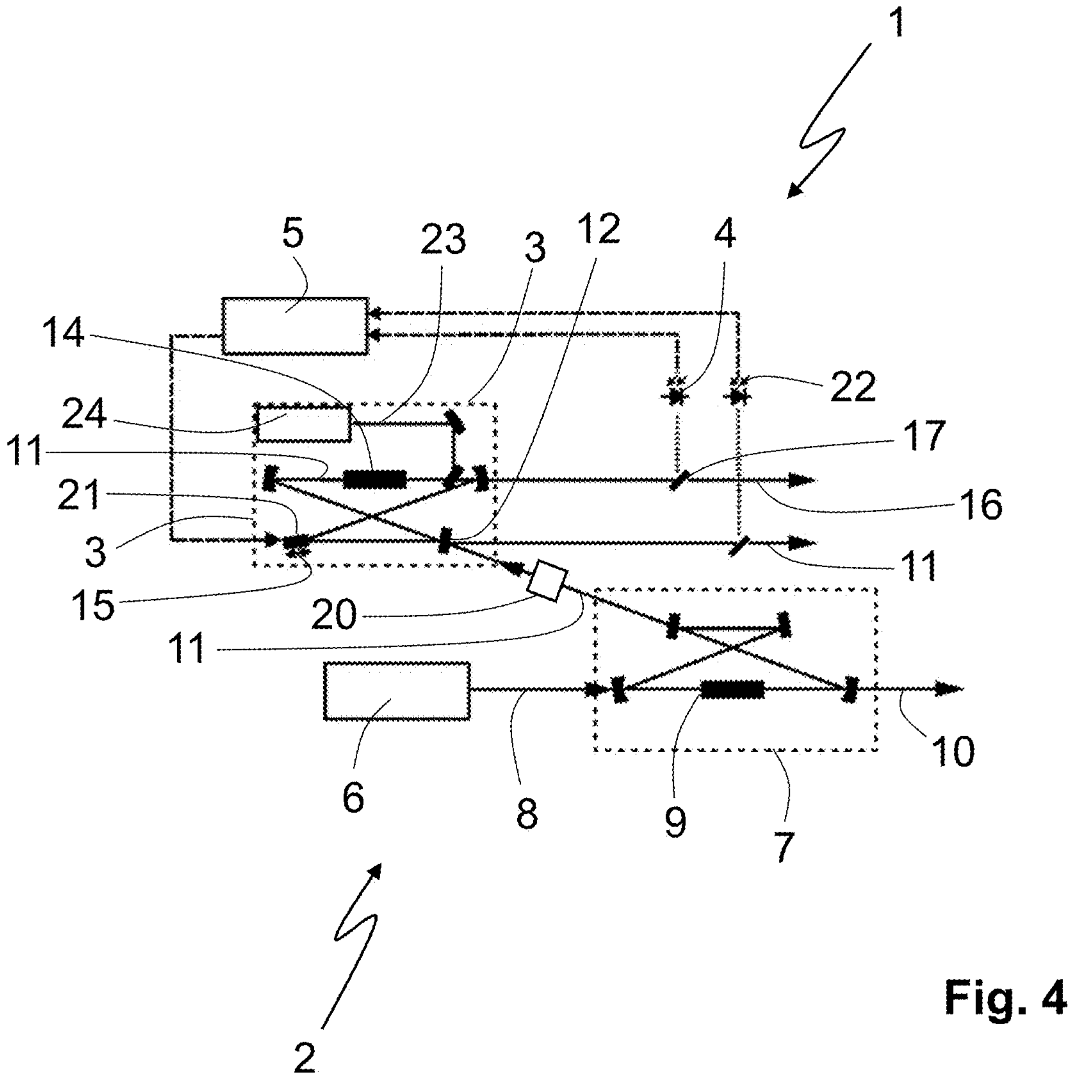
FIG. 4 is a schematic representation of a further embodiment of the radiation source according to the invention.

FIG. 4 shows an alternative embodiment of the radiation source 1. The radiation source 1 of FIG. 4 differs from the radiation source of FIGS. 2 and 3 in that the frequency converter 3 is formed by a sum or difference frequency generator instead of a frequency doubler. The crystal 14 is selected so that converted radiation at a sum or difference frequency of the frequencies of the signal radiation 11 and the mixed radiation 23 of a mixed laser 24 is generated in the crystal. The arrangement of FIG. 4 can also be switched between the first and second modes of operation as previously described for the arrangement of FIGS. 2 and 3.

For purposes of the original disclosure, it is pointed out that all features as they become apparent to a person skilled in the art from the present description, the drawings and the claims, even if they have been specifically described only in connection with certain further features, can be combined both individually and in any combinations with other of the features or groups of features disclosed herein, insofar as this has not been expressly excluded or technical circumstances render such combinations impossible or pointless. A comprehensive, explicit description of all conceivable combinations of features is omitted here only for the sake of brevity and readability of the description.

While the invention has been illustrated and described in detail in the drawings and the foregoing description, this illustration and description are merely exemplary and are not intended to limit the scope of protection as defined by the claims. The invention is not limited to the embodiments disclosed.

Variations of the disclosed embodiments will be apparent to those skilled in the art from the drawings, description and appended claims. In the claims, the word "comprising" does not exclude other elements or steps, and the indefinite article "one" or "a" does not exclude a plurality. The mere fact that certain features are claimed in different claims does not exclude their combination. Reference numbers in the claims are not intended to limit the scope of protection.

LIST OF REFERENCE NUMBERS

1 Radiation source
2 Initial source
3 Frequency converter
4 Conversion detector
5 Controller
6 Pump laser
7 Optical parametric oscillator
8 Pump radiation
9 Non-linear optical crystal of the optical parametric oscillator 7
10 Idler radiation
11 Signal radiation
12 Coupling mirror
13 Resonator of the frequency converter 3
14 Non-linear optical crystal of frequency converter 3
15 Piezo-adjustor
16 Converted radiation
17 Beam splitter
18 Conversion measurement signal
19 Conversion control signal
20 Electro-optical modulator
21 Mirror
22 Signal radiation detector
23 Mixed radiation
24 Mixing laser

The invention claimed is:

1. A radiation source for generating electromagnetic radiation at a plurality of frequencies, wherein the radiation source comprises:

an initial source, wherein the initial source is arranged to generate electromagnetic initial radiation comprising an initial centre frequency during operation of the radiation source;

a non-linear optical frequency converter, wherein the frequency converter comprises a converter resonator which is resonant for the initial radiation and comprises an input coupling mirror which is partially transparent for the initial radiation and a non-linear optical crystal which is arranged in the converter resonator, wherein the frequency converter is located in a beam path of the initial radiation so that during operation of the radiation source the initial radiation is coupled into the converter resonator through the coupling mirror, wherein the frequency converter is arranged such that during operation of the radiation source the frequency converter generates converted radiation at a converted frequency from the initial radiation, the converted frequency being different from a frequency of the initial radiation, and wherein the converter resonator comprises an actuator, and wherein the actuator is located and arranged such that a resonance frequency of the converter resonator is tunable by the actuator in dependence on a conversion control signal;

a conversion detector, wherein the conversion detector is located in a beam path of the converted radiation or in the beam path of the initial radiation in the beam direction behind the coupling mirror so that the conversion detector detects a measure of the power of the converted radiation during operation of the radiation source and outputs a conversion measurement signal representing the measure of the power of the converted radiation; and a controller, wherein the controller is connected to the conversion detector such that the controller receives the conversion measurement signal during operation of the radiation source, wherein the controller is connected to the actuator such that the actuator receives the conversion control signal from the controller during operation of the radiation source, and wherein the controller is arranged, during operation of the radiation source in a first mode of operation, to generate the conversion control signal in dependence on the conversion measurement signal such that the resonance frequency is controlled to follow the initial centre frequency, wherein the controller is set up in such a way that the controller is selectably switchable between the first mode of operation and a second mode of operation during operation of the radiation source, wherein the controller is arranged to generate the conversion control signal in the second mode of operation such that the power of the converted radiation is controlled, that either the power of the converted radiation has a smaller relative temporal fluctuation than the power of the initial radiation in the beam direction in front of the coupling mirror or the power of the initial radiation in the beam direction after the coupling mirror has a smaller relative temporal fluctuation than the power of the initial radiation in the beam direction in front of the coupling mirror.

2. The radiation source according to claim 1, wherein the frequency converter is a frequency doubler, wherein the non-linear optical crystal is a doubler crystal, such that the converted frequency is equal to twice the frequency of the signal radiation.

3. The radiation source according to claim 1, wherein the initial source comprises a pump laser and an optical parametric oscillator, wherein the pump laser is arranged to generate electromagnetic pump radiation during operation of the radiation source, wherein the optical parametric oscillator is located in a beam path of the pump radiation, and wherein the optical parametric oscillator is arranged to generate signal radiation comprising a signal centre frequency and Idler radiation from the pump radiation during operation of the radiation source such that the signal radiation is the initial radiation.

4. The radiation source according to claim 1, wherein the controller is arranged to perform in the second operating mode the steps of a) forming an error signal as the difference between the conversion measurement signal and a predetermined constant offset signal, and b) generating the conversion control signal so that the error signal becomes minimal.

5. The radiation source according to claim 1, wherein the radiation source comprises a modulator wherein the modulator is located in the beam path of the initial radiation between the optical parametric oscillator and the frequency converter, wherein the modulator is arranged to impose a phase modulation with a modulation frequency on the initial radiation, and wherein the controller is arranged to perform in the first mode of operation the steps of i) mixing the conversion measurement signal with a reference signal modulated at the modulation frequency to form a mixed signal comprising a non-modulated term and a term modulated at twice the modulation frequency, ii) filtering the mixed signal to produce an error signal containing only the non-modulated term; and iii) generating the conversion control signal such that the error signal is minimised.

6. The radiation source according to claim 5, wherein the modulator is connected to the controller such that the modulator receives a modulator control signal from the controller during operation of the radiation source, and wherein the controller is arranged such that during operation of the radiation source in the first mode of operation the controller generates the modulator control signal such that the modulator modulates the initial radiation and in the second mode of operation the controller generates the modulator control signal such that the modulator does not modulate the initial radiation.

7. The radiation source according to claim 1, wherein the radiation source comprises an initial radiation detector, wherein the initial radiation detector is located in the beam path of the initial radiation in front of the coupling mirror in the beam direction, such that the initial radiation detector detects a measure of the power of the initial radiation during operation of the radiation source and outputs an initial radiation measurement signal representing the measure of the power of the initial radiation, wherein the controller is connected to the initial radiation detector such that the controller receives the initial radiation measurement signal during operation of the radiation source, wherein the controller is connected to the initial source such that the initial source receives an initial radiation control signal from the controller during operation of the radiation source, and wherein the controller is arranged to generate the initial radiation control signal during operation of the radiation source in dependence on the initial radiation measurement signal such that a power of the initial radiation is controlled such that the power is substantially equal to a predetermined target power.

8. The radiation source according to claim 7, wherein the initial source comprises a pump laser and an optical parametric oscillator, wherein the pump laser is arranged to generate electromagnetic pump radiation during operation of the radiation source, wherein the optical parametric oscillator is located in a beam path of the pump radiation, wherein the optical parametric oscillator is arranged to generate signal radiation comprising a signal centre frequency and Idler radiation from the pump radiation during operation of the radiation source such that the signal radiation is the initial radiation, and wherein the controller is connected to the pump laser such that the pump laser receives the initial radiation control signal from the controller during operation of the radiation source, and wherein the controller is arranged such, that during operation of the radiation source the controller generates the initial radiation control signal in dependence on the initial radiation measurement signal such that a pumping power of the pumping radiation is controlled such that the pumping power is substantially equal to a predetermined desired pumping power.

9. The radiation source according to claim 3, wherein radiation source is configured such that during operation the radiation source emits at least two radiations selected from the converted radiation of the signal radiation or the Idler radiation or the pump radiation.

10. A method for generating electromagnetic radiation at a plurality of frequencies, wherein the method comprises the steps of:

generating electromagnetic initial radiation comprising an initial centre frequency by an initial radiation source;

coupling the initial radiation through a coupling mirror into a converter resonator resonant for the initial radiation;

generating converted radiation at a converted frequency from the initial radiation in a non-linear optical crystal arranged in the converter resonator, wherein the converted frequency is different from a frequency of the initial radiation;

detecting a measure of the power of the converted radiation with a conversion detector arranged in a beam path of the converted radiation or in the beam path of the initial radiation in the beam direction behind the coupling mirror;

in a first operating mode, controlling a resonance frequency of the converter resonator as a function of the measure of the power of the converted radiation, so that the resonance frequency follows the initial centre frequency;

selectively switching between the first mode of operation and a second mode of operation;

in the second mode of operation, controlling the power of the converted radiation such that either the power of the converted radiation has a smaller relative variation over time than the power of the initial radiation in the beam direction in front of the coupling mirror or the power of the initial radiation in the beam direction behind the coupling mirror has a smaller relative variation over time than the power of the initial radiation in the beam direction in front of the coupling mirror.

* * * * *